United States Patent
Summerfelt et al.

(10) Patent No.: US 9,773,793 B2
(45) Date of Patent: Sep. 26, 2017

(54) TRANSISTOR PERFORMANCE MODIFICATION WITH STRESSOR STRUCTURES

(75) Inventors: Scott R. Summerfelt, Garland, TX (US); Rajni J. Aggarwal, Garland, TX (US); Shaoping Tang, Plano, TX (US)

(73) Assignee: TEXAS INSTUMENTS INCORPORATED, Dallas, TX (US)

( * ) Notice: Subject to any disclaimer, the term of this patent is extended or adjusted under 35 U.S.C. 154(b) by 940 days.

(21) Appl. No.: 12/576,310

(22) Filed: Oct. 9, 2009

(65) Prior Publication Data

US 2011/0084323 A1  Apr. 14, 2011

(51) Int. Cl.
*H01L 21/02* (2006.01)
*H01L 21/00* (2006.01)
*H01L 27/11507* (2017.01)
*H01L 49/02* (2006.01)
*H01L 29/78* (2006.01)

(52) U.S. Cl.
CPC ........ *H01L 27/11507* (2013.01); *H01L 28/55* (2013.01); *H01L 29/7833* (2013.01); *H01L 29/7843* (2013.01)

(58) Field of Classification Search
CPC ................................................. H01L 27/11507
USPC ........................ 257/295, 25, E21.664; 438/3
See application file for complete search history.

(56) References Cited

U.S. PATENT DOCUMENTS

| | | | | |
|---|---|---|---|---|
| 4,888,630 A | * | 12/1989 | Paterson | 365/185.24 |
| 5,218,512 A | * | 6/1993 | Nakamura | 361/321.1 |
| 5,524,093 A | * | 6/1996 | Kuroda | 365/145 |
| 5,550,770 A | * | 8/1996 | Kuroda | 365/145 |
| 6,140,672 A | * | 10/2000 | Arita et al. | 257/295 |
| 6,194,752 B1 | * | 2/2001 | Ogasahara et al. | 257/295 |
| 6,396,094 B1 | * | 5/2002 | Mirkarimi | C23C 16/409 257/295 |
| 6,462,366 B1 | * | 10/2002 | Hsu et al. | 257/295 |
| 6,809,954 B1 | * | 10/2004 | Madan et al. | 365/145 |
| 6,974,985 B2 | * | 12/2005 | Kurasawa et al. | 257/296 |
| 7,339,218 B2 | | 3/2008 | Hidaka et al. | |
| 7,973,350 B2 | * | 7/2011 | Collonge et al. | 257/295 |
| 2002/0008263 A1 | * | 1/2002 | Hirano et al. | 257/296 |
| 2003/0214830 A1 | * | 11/2003 | Rickes et al. | 365/145 |
| 2004/0147047 A1 | * | 7/2004 | Cross | G11C 11/22 438/3 |
| 2004/0229384 A1 | * | 11/2004 | Kijima et al. | 438/3 |
| 2005/0128663 A1 | * | 6/2005 | Yamazaki et al. | 361/56 |
| 2005/0145908 A1 | * | 7/2005 | Moise | H01L 27/11502 257/295 |

(Continued)

OTHER PUBLICATIONS

Summerfelt et al., "Drawn Dummy FeCAP, Via and Metal Structures," Nonprovisional Patent Application filed Oct. 9, 2009; U.S. Appl. No. 12/576,340. Texas Instruments Incorporated. Dallas, TX.

*Primary Examiner* — Matthew Landau
*Assistant Examiner* — Igwe U Anya
(74) *Attorney, Agent, or Firm* — Rose Alyssa Keagy; Charles A. Brill; Frank D. Cimino

(57) ABSTRACT

A transistor structure with stress enhancement geometry aligned above the channel region. Also, a transistor structure with stress enhancement geometries located above and aligned with opposite sides of the channel region. Furthermore, methods for fabricating integrated circuits containing transistors with stress enhancement geometries.

19 Claims, 18 Drawing Sheets

(56) References Cited

U.S. PATENT DOCUMENTS

| | | | |
|---|---|---|---|
| 2007/0222035 A1* | 9/2007 | Huang et al. | 257/618 |
| 2008/0061285 A1* | 3/2008 | Arghavani et al. | 257/20 |
| 2008/0258191 A1* | 10/2008 | Baniecki | H01L 27/10852 |
| | | | 257/295 |
| 2008/0283877 A1* | 11/2008 | Collonge et al. | 257/254 |
| 2008/0293195 A1* | 11/2008 | Krivokapic | 438/199 |
| 2008/0308873 A1* | 12/2008 | Chen et al. | 257/369 |
| 2009/0108378 A1* | 4/2009 | Zhu et al. | 257/412 |
| 2009/0170319 A1* | 7/2009 | Richter et al. | 438/692 |
| 2010/0012994 A1* | 1/2010 | Ozaki et al. | 257/295 |
| 2010/0072553 A1* | 3/2010 | Xu et al. | 257/369 |

* cited by examiner

TRANSISTOR PERFORMANCE MODIFICATION WITH STRESSOR STRUCTURES

CROSS-REFERENCE TO RELATED APPLICATIONS

The following co-pending patent application is related and hereby incorporated by reference: U.S. patent application Ser. No. 12/576,340 (Texas Instruments docket number TI-67122, titled "Drawn Dummy FeCAP, Via, and Metal Structures") filed simultaneously with this application. With its mention in this section, this patent application is not admitted to be prior art with respect to the present invention.

FIELD OF THE INVENTION

This invention is directed in general to a semiconductor device, and more specifically, to a semiconductor device fabricated using a process to enhance transistor performance with channel stress.

DETAILED DESCRIPTION

Figure 1A:
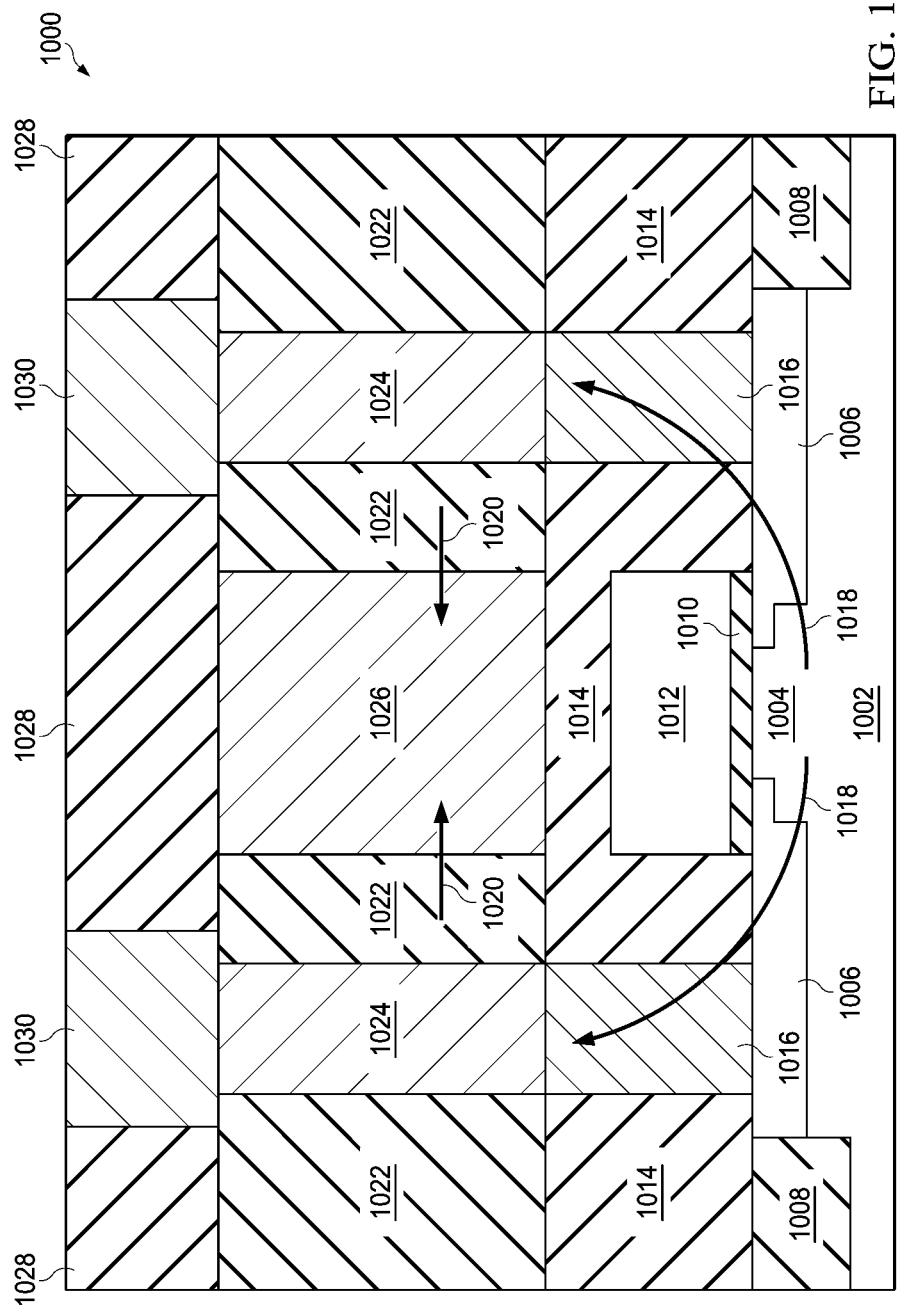
FIGS. 1A and 1B are transistor structures incorporating a first embodiment.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders or concurrently with other acts or events. Furthermore, not all illustrated acts or events are required to implement a methodology in accordance with the present invention.

Some integrated circuits build devices such as ferroelectric capacitors in a PMD2 layer between the PMD1 layer and the first interconnect layer. The materials used for the FeCaps may have high stress. Therefore, stress enhancement structures may be formed by using FeCap material that is placed in alignment with transistor structures that are located in the first contact layer. These stress enhancement structures may apply additional stress to the transistor channel—enhancing carrier mobility and thus transistor performance. Moreover, these stress enhancement structures may be formed with no additional processing cost.

The term "center alignment" refers to the alignment of a stress enhancement structure that is placed directly over a transistor gate. The center line of the stress enhancement structure is aligned with the center line of the transistor gate.

The term "offset alignment" refers to a stress enhancement structure that has two stress enhancement geometries where the edge of one stress enhancement geometry is aligned to one edge of the transistor gate and the edge of a second stress enhancement geometry is aligned to the other edge of the transistor gate. The stress enhancement geometries in offset alignment are on opposite sides of the transistor gate.

FIG. 1A is an illustration of a transistor structure (1000) employing one embodiment with a stress enhancement structure (1026) having center alignment to the transistor gate (1012). This stress enhancement structure (1026) may apply stress as indicated by arrows (1018) to the channel region (1004). The device structure (1000) includes a substrate (1002), a channel region (1004), source and drain regions (1006), shallow trench isolation (STI) regions (1008), gate dielectric (1010), a first premetal dielectric (PMD1) layer (1014), first contacts (cont-1)(1016), a second premetal dielectric (PMD2) layer (1022), second contacts (cont-2)(1024), interlevel metal dielectric (IMD1) layer (1028), metal-1 (1030), and stress enhancement structure (1026). Other metal geometries and structures such as sidewalls and stressor layers are not shown in FIG. 1A for purposes of simplicity but may be present in a fully processed device structure.

In FIG. 1A stress enhancement structure (1026) is shown to be compressive as indicated by arrows (1020) and may apply tensile stress to the channel (1004) as indicated by arrows (1018). Stress enhancement structure (1026) may be sized larger to apply more stress to the channel region (1004). The thickness of PMD1 layer (1014) also may be reduced to apply more stress to the channel region (1004).

Figure 1B:
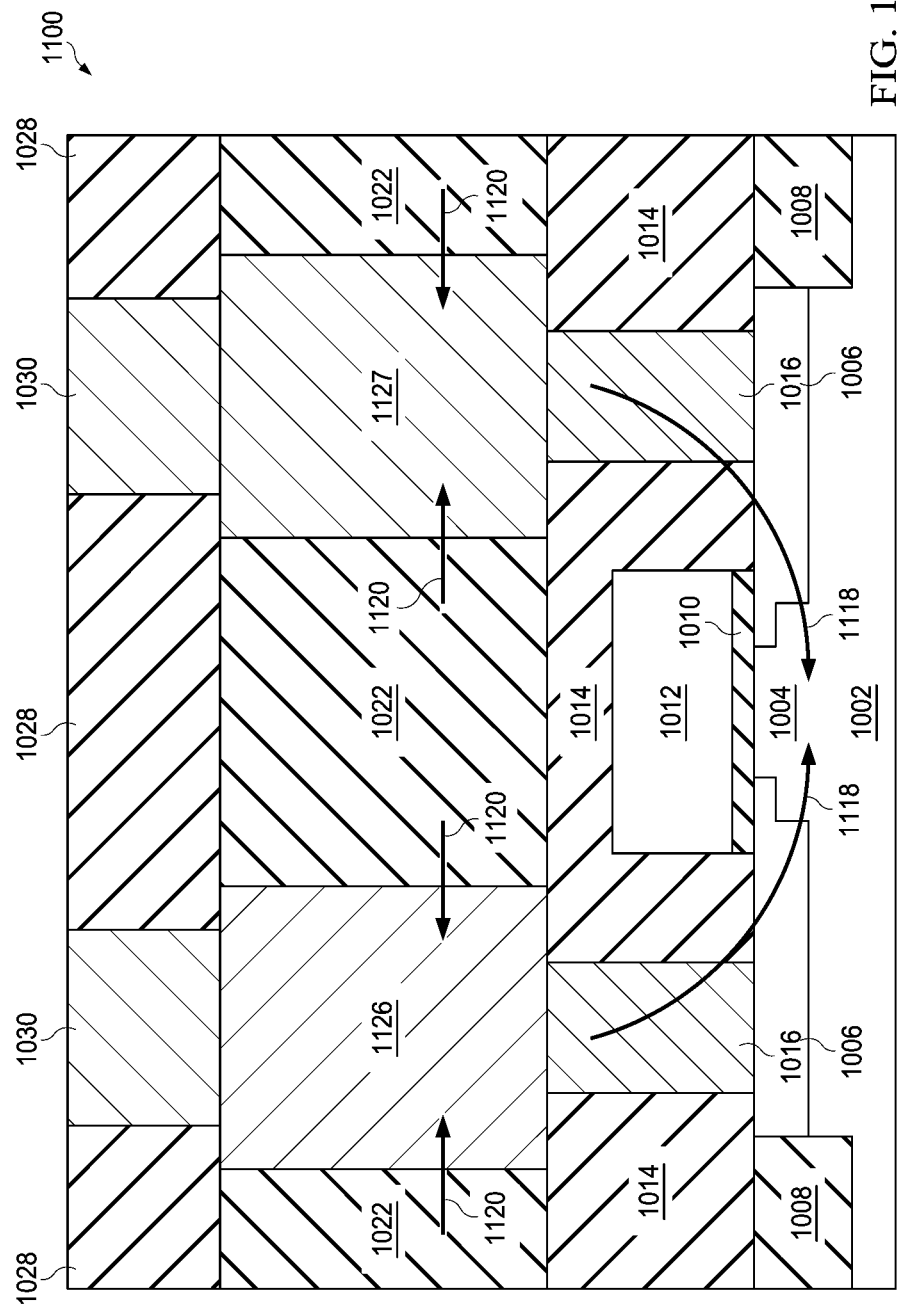

FIG. 1B is an illustration of a transistor structure (1100) employing stress enhancement structures (1126, 1127) with offset alignment. Specifically, a first stress enhancement geometry (1126) is aligned to one side of the gate (1012) and a second stress enhancement geometry (1127) is aligned to the other side of the gate (1012) The stress enhancement geometries (1126) and (1127) are shown to be compressive as indicated by arrows (1120). The compressive stress enhancement geometries may create tensile stress over the gate and may apply a compressive force to the channel (1004) as indicated by arrows (1118). The width of stress enhancement geometries (1126) and (1127) may be adjusted to apply increased or reduced stress to channel region (1004). The thickness of PMD1 layer (1014) may also be reduced to increase the stress to channel region (1004).

As is evident from the embodiments, a compressive stress enhancement structure may be used to apply either a compressive force (1118) as in FIG. 1A or a tensile force (1018) as in FIG. 1B to the channel (1004) by a different placement of the stress enhancement geometries with respect to the channel region (1004).

Figure 2A:
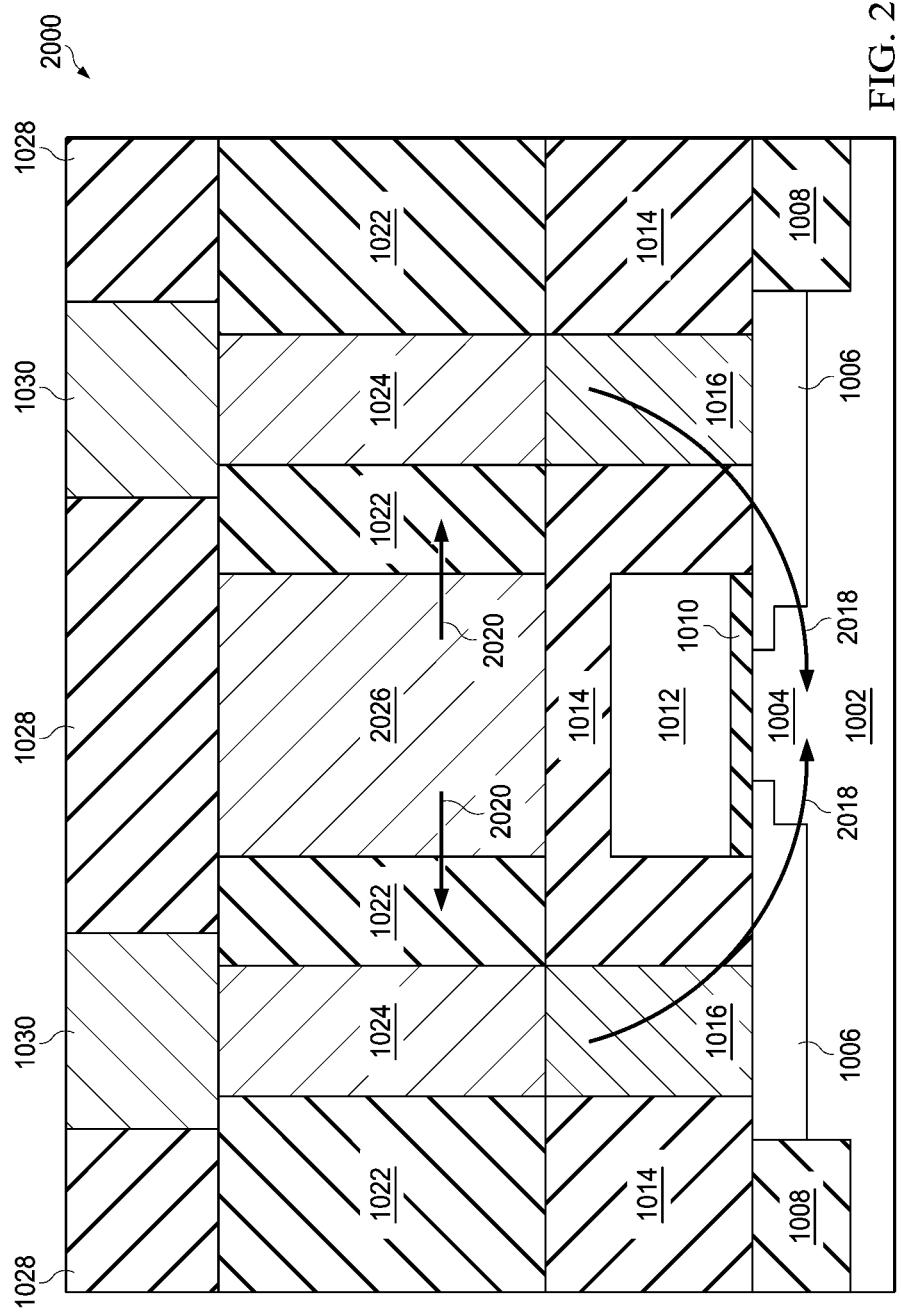
FIGS. 2A and 2B are transistor structures incorporating a second embodiment

In the center aligned device structure (2000) of FIG. 2A a stress enhancement structure (2026) with tensile stress as indicated by arrows (2020) may apply compressive stress as indicated by arrows (2018) to the channel (1004). The width of tensile stress enhancement structure (2026) may be adjusted to apply increased or reduced stress to channel region (1004). The thickness of PMD1 layer (1014) may also be reduced to increase stress to channel region (1004).

Figure 2B:
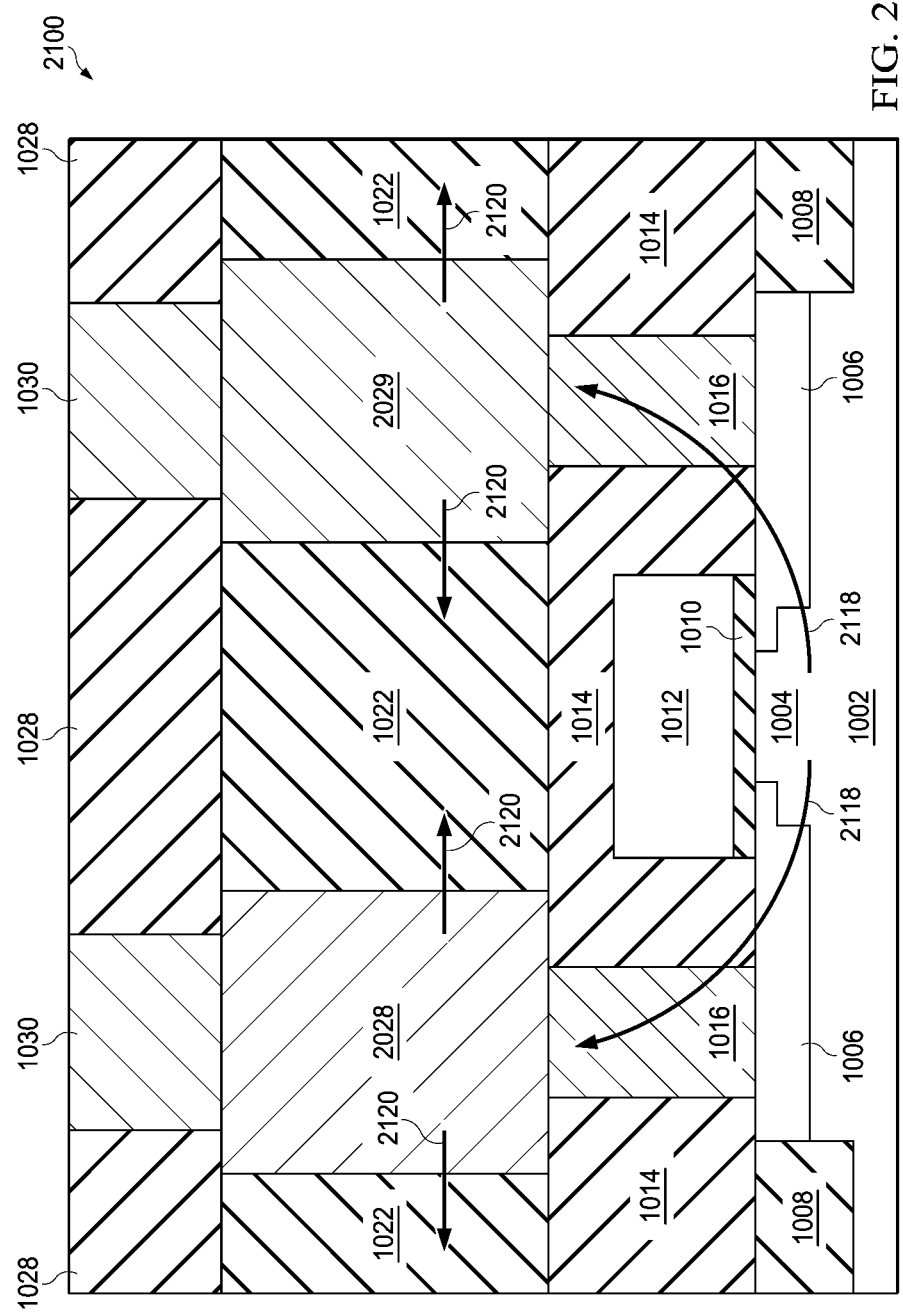

In the offset aligned transistor structure (2100) of FIG. 2B a first of the stress enhancement geometries (2028) has been formed on one side of the channel (1004) and a second stress enhancement geometry (2029) has been formed on the other side of the channel (1004). The enhancement geometries (2028, 2029) are tensile as indicated by arrows (2120) and may apply a tensile force to the channel (1004) as indicated by arrows (2118). The width of tensile stress enhancement geometries (2028) may be adjusted to apply increased or reduced stress to channel region (1004). The thickness of PMD1 layer (1014) may also be reduced to increase stress.

As is evident from the embodiment illustrated in FIGS. 2A and 2B, a tensile stress structure may be used to apply either a compressive force (2018) as in FIG. 2A or a tensile force (2118) as in FIG. 2B to the channel (1004) by a different placement of the tensile stress geometries with respect to the channel region (1004).

It is to be noted that the compressive stress structure (shown in FIGS. 1A and 1B) and the tensile stress structure (shown in FIGS. 2A and 2B) may be used to provide desirable stress to the channel region of a CMOS transistor to enhance carrier mobility. For example, compressive stress applied to the channel of a PMOS transistor may enhance hole mobility and improve PMOS transistor performance. Conversely, tensile stress applied to the channel region of the NMOS transistor may enhance electron mobility and improve NMOS transistor performance.

Figure 3A:
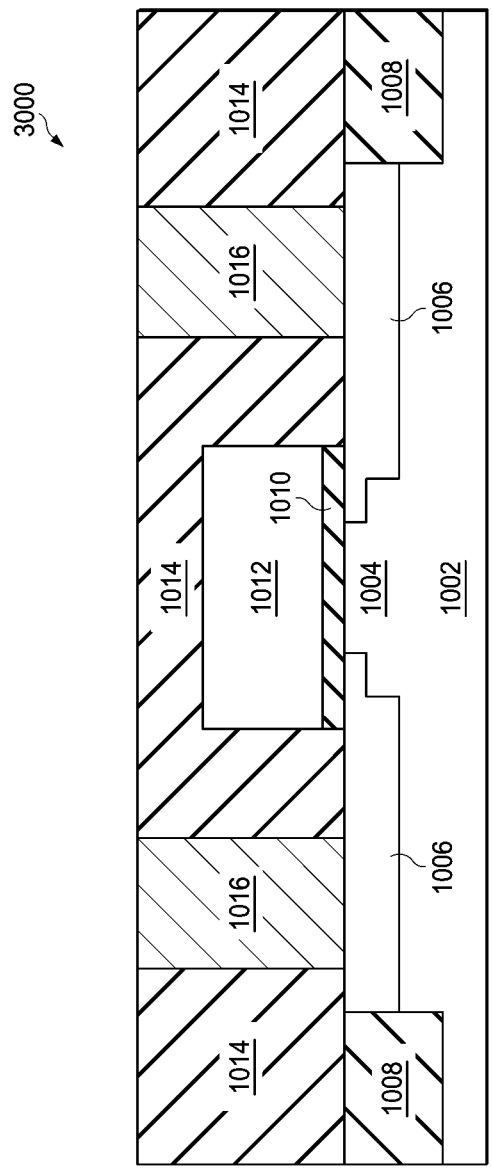
FIG. 3A through FIG. 3E are illustrations of the steps in the fabrication of an integrated circuit according to a third embodiment.
Figure 3B:
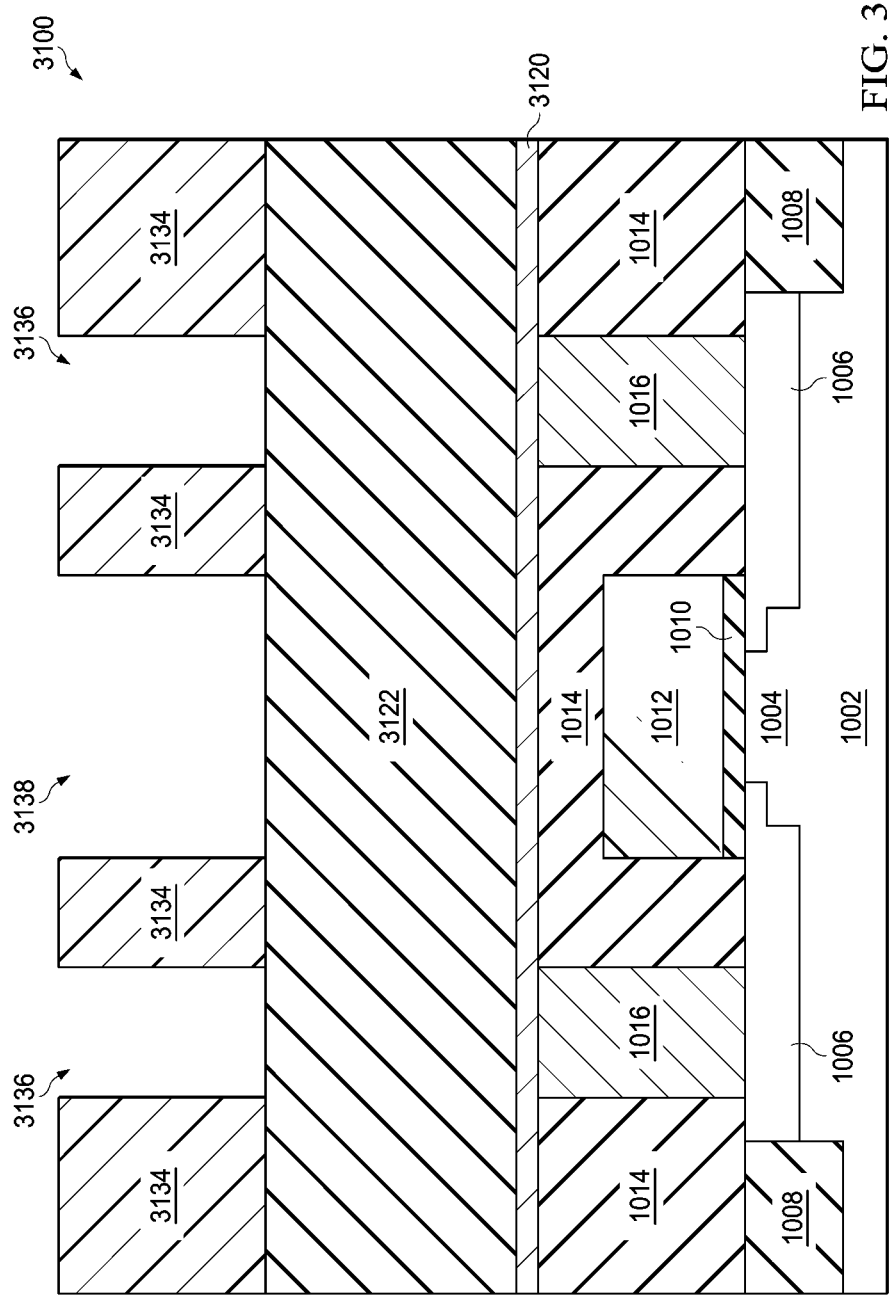
Figure 3C:
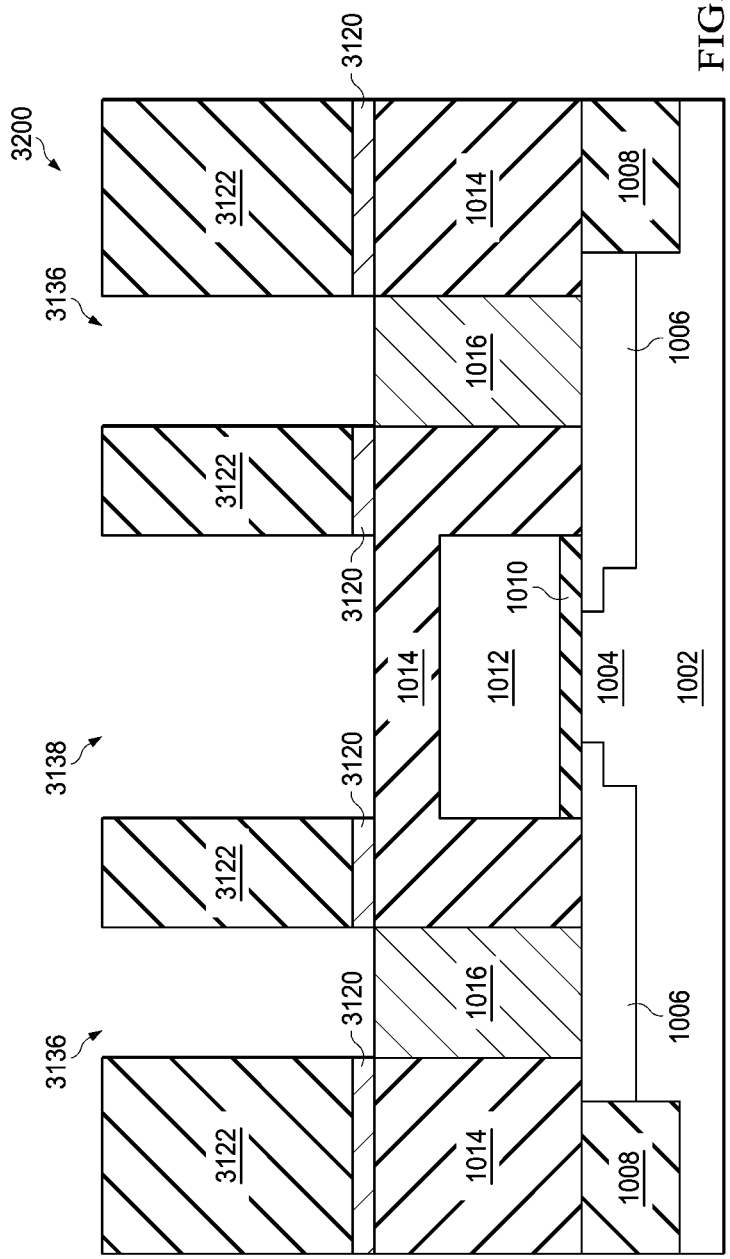

FIGS. 3A through 3C illustrate the major steps in building stress enhancement structures according to an embodiment which utilizes a PMD2 layer.

FIG. 3A shows an integrated circuit (3000) that has been partially processed up to and including a PMD1 layer (1014) and first contacts (1016). The transistor structure (3000) includes a substrate (1002), shallow trench isolation (STI) regions (1008), a channel region (1004), a gate dielectric (1010), a gate (1012), source and drain regions (1006), a first dielectric, PMD1, (1014), and first contacts (cont-1).

FIG. 3B shows the integrated circuit (3100) after the deposition of an etch stop layer (3020) and PMD2 (3122). A photoresist pattern (3134) has been formed on PMD2 (3122) with openings for second contacts (cont-2) (3136) and an opening (3138) for a center aligned stress enhancement structure.

FIG. 3C shows the integrated circuit (3200) after the holes for the second contacts (3136) and the stress enhancement structure (3138) have been etched in the PMD2 layer (3122) and the etch stop layer (3120) and then the photoresist pattern (3134) removed.

Figure 3D:
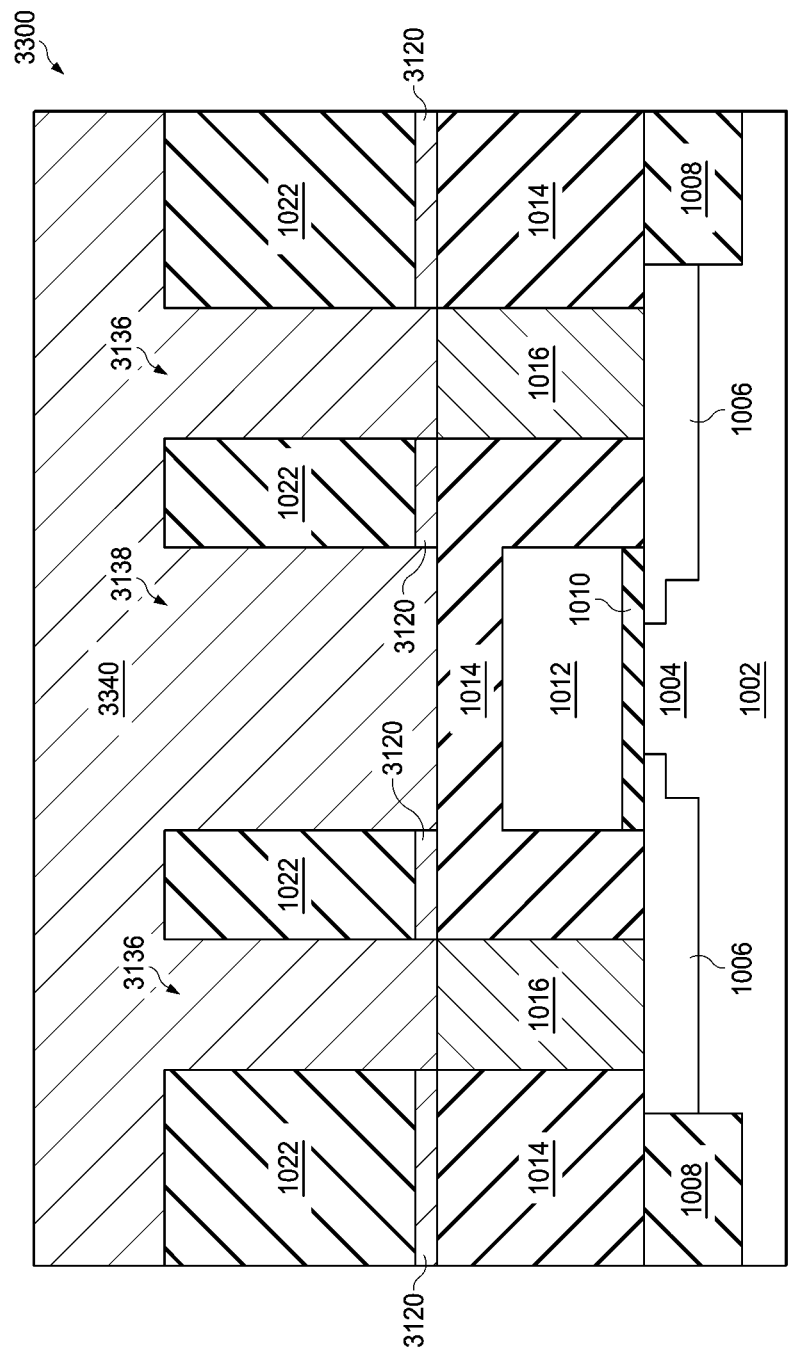

FIG. 3D shows the integrated circuit (3300) after the stress material (3340) is deposited to fill the holes for the second contacts (3136) and the stress enhancement structure (3138).

Figure 3E:
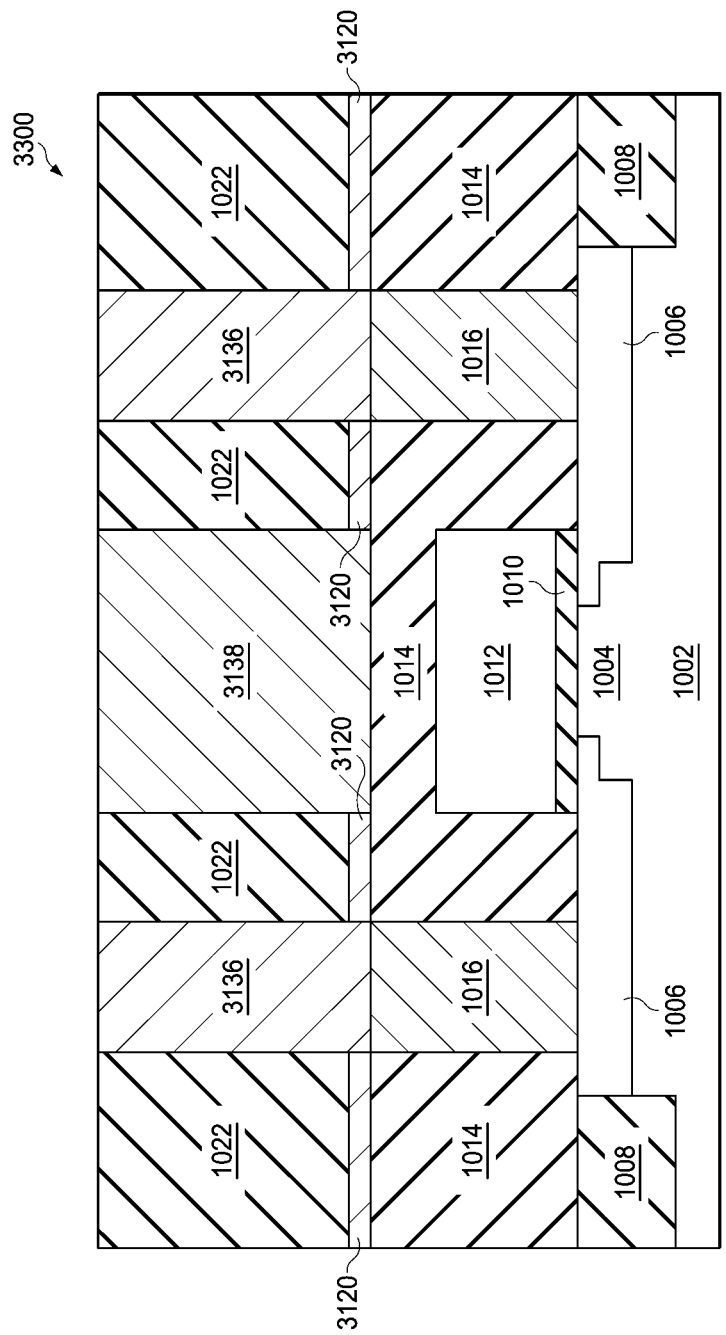

In FIG. 3E the overfill portion of the stress material (3340) is planarized by etch back or CMP (preferred). The method illustrated in this embodiment uses the same material to fill the second contacts (3136) and stress enhancement structure (3138) to save cost, but it is understood that the cont-2s (3136) and the stress enhancement structure (3138) may be patterned, etched, and filled separately with different materials deposited into the cont-2s and stress enhancement structure. Furthermore, the deposition process for the stress enhancement material may be modified to change the stress. An example is the deposition of stress enhancement material, TiAlN where, depending upon the deposition conditions, the stress may range from tensile to compressive.

Another example of a stress enhancement material where the stress may be changed by the process deposition conditions is SiN. Depending upon deposition conditions, the stress of SiN may range from highly compressive to highly tensile. Moreover, in some cases the cont-2s are first lined with TiN or WN and then filled with CVD-W.

The stress of CVD-W is typically tensile at room temperature due to the coefficient of thermal expansion (CTE). However, the stress of CVD-W filled cont-2s may be modified by adjusting the thickness and stress of the liner material which may be TiN or WN or a material such as Ta, Ru, TaN, TaC, RuN, TiN, TiW, TiWN, WN, TiSiN, TaSiN, TiC, or TiCON. The stress of refractory metals such as W, Ta, Ti, and Ru or refractory metal compounds such as WN, TiN and TaN may be modified by the addition or modification of the deposition conditions or the thickness of the liner materials. It is easier to change the stress of these materials by varying their deposition conditions because—unlike conventional interconnect metals such as Cu and Al—the refractory metals and their compounds are hard and do not stress relieve. It is therefore possible to modify the stress of the cont2 stress enhancement structure by modifying the stress of the materials during deposition.

The stress enhancement structure (3238) over the transistor may be an electronically active structure that carries signals or it may be a dummy structure. It is understood that the stress material may be tensile or compressive and it is also understood that the stress enhancement geometries (3238) may also be aligned with offset alignment to provide the opposite sign stress to the channel region (1004), as discussed supra. Additional interconnect layers may be formed on top of the transistor device structure (3200) to complete the integrated circuit fabrication. Moreover, the stress on the transistor channel (1004) may also be enhanced by over-sizing the holes for cont-2 (3136) and then filling the holes for cont-2 (3136) with the opposite stress material, as discussed infra and illustrated in FIGS. 4A-4E.

Figure 4A:
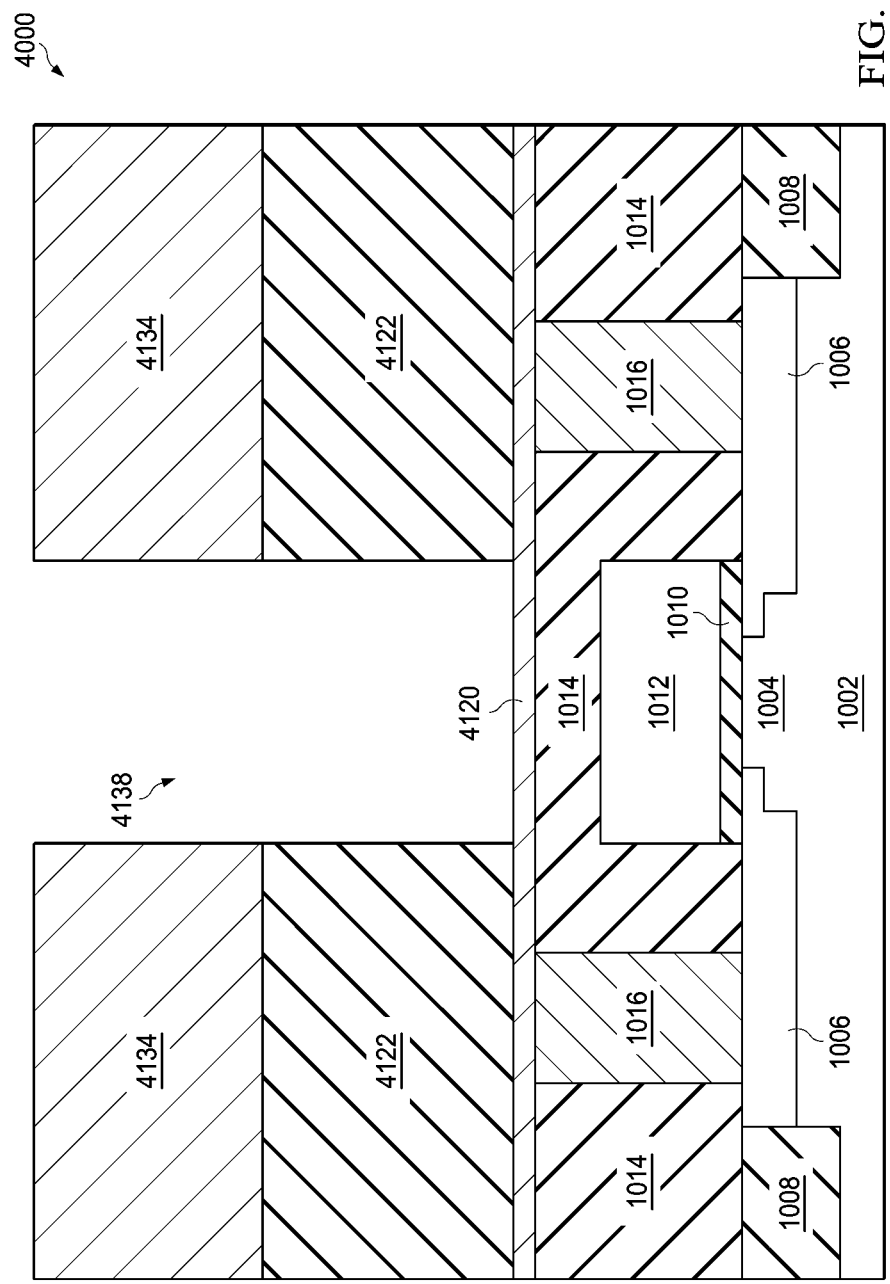
FIG. 4A through FIG. 4D are illustrations of the steps in the fabrication of integrated circuits according to a fourth embodiment.

FIG. 4A shows an integrated circuit (4000) that has been processed up through and including PMD1 (1014) and cont-1 (1016). An etch stop layer (4120) and PMD2 (4122) is then deposited and patterned with a stress enhancement photoresist pattern (4134). The PMD2 layer is then etched, with the etch process stopping on the etch stop layer (4120) to form the center aligned stress enhancement structure (4138).

Figure 4B:
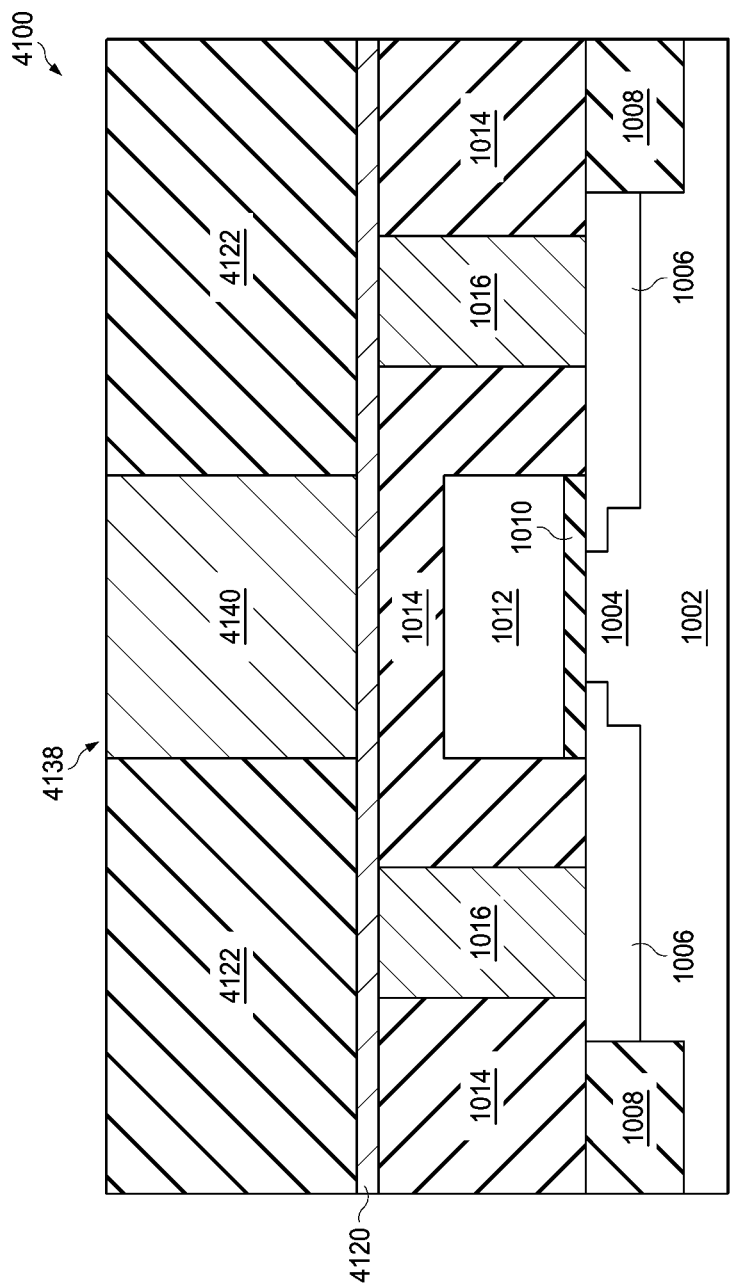

In FIG. 4B the stress enhancement structure pattern (4134) is removed and the hole for the stress enhancement structure (4138) is filled with a first stress enhancement material (4140) and subsequently planarized.

Figure 4C:
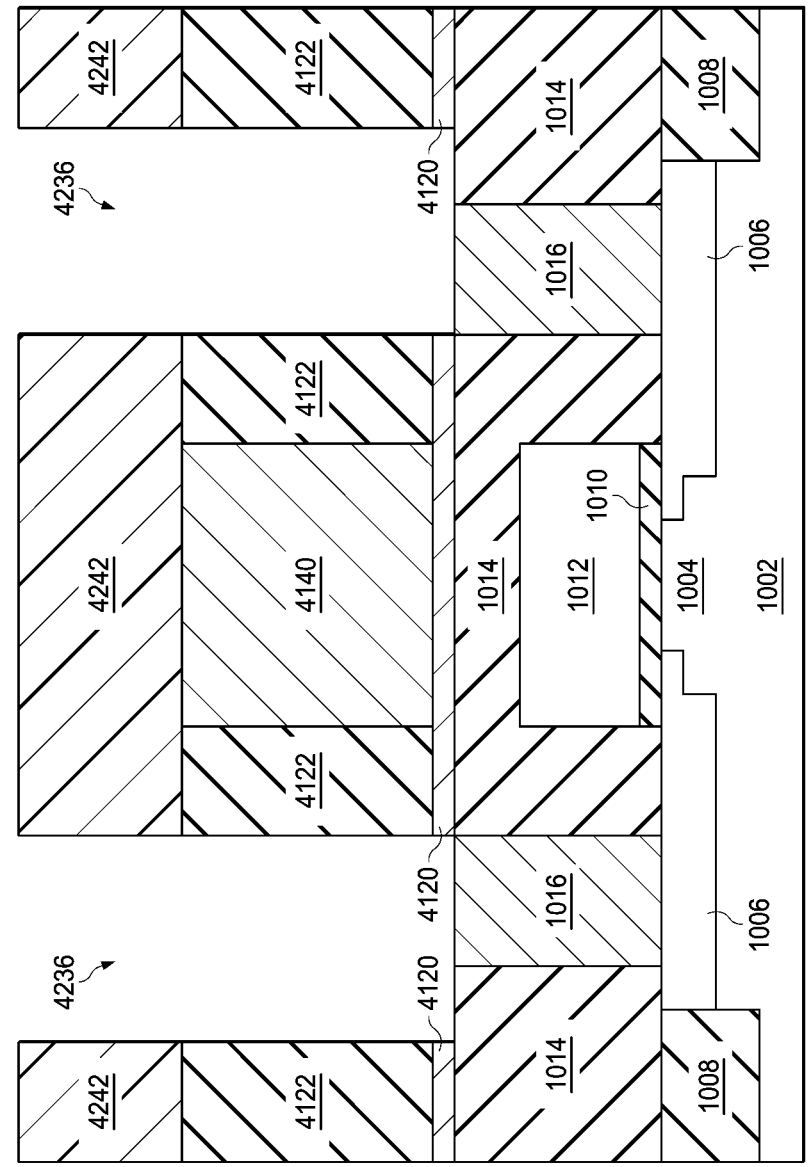
Figure 4D:
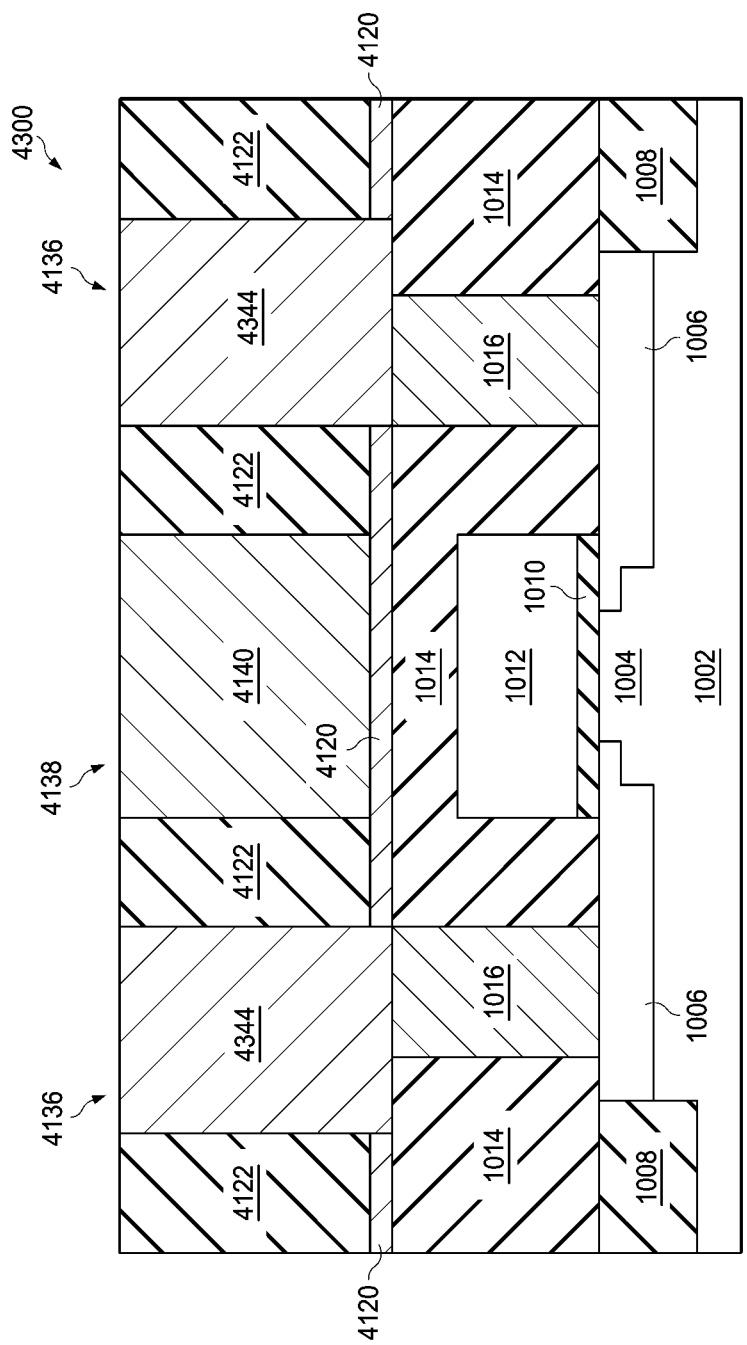

In FIG. 4C a second contact pattern (4242) is formed on the integrated circuit with cont-2 openings (4236). These cont-2 openings (4236) are oversized with respect to first contacts (1016) to also function as offset aligned stress enhancement structures. The cont-2 openings (4236) are etched through the PMD2 layer (4122) and etch stop layer (4120) to form electrical connection with the first contacts (1016).

A second stress enhancement material (4344) with a stress opposite to the first stress enhancement material (4140) is deposited to fill the openings for cont-2 (4236) and the stress enhancement material (4140) is subsequently planarized. Additional stress may be applied to the channel region by forming a center aligned stress enhancement structure (4138) with a first type of stress and also forming offset aligned stress enhancement structures (4236) with an opposite type of stress.

A process flow describing another embodiment is described in FIGS. 5A through 5D.

Figure 5A:
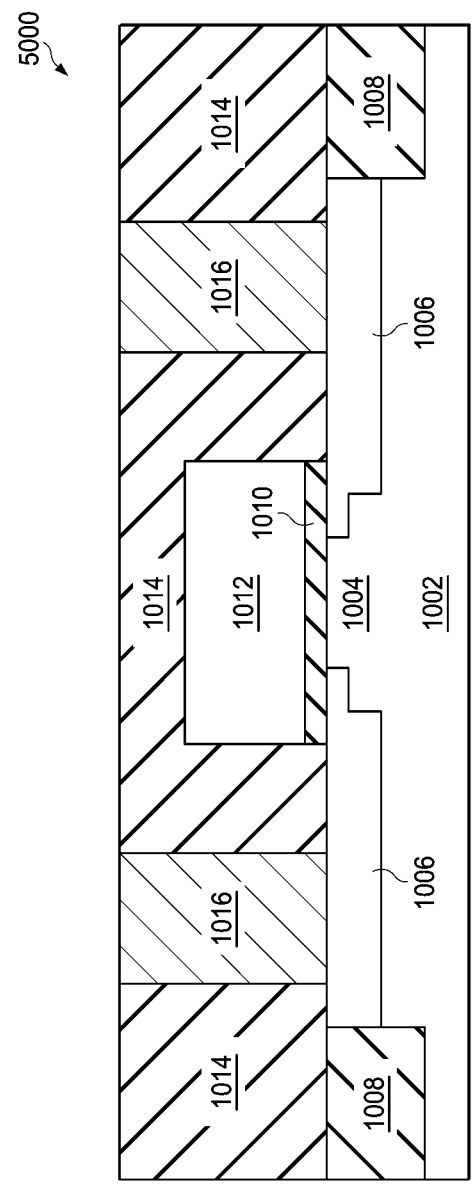
FIGS. 5A-5D and FIG. 6 illustrate additional embodiments.

A transistor device structure (5000) that has been partially processed through PMD1 and cont-1 formation, is shown in FIG. 5A. The transistor structure includes a substrate (1002), STI regions (1008), a channel region (1004), a gate dielectric (1010), a gate (1012), source and drain regions (1006), dielectric PMD1 (1014), and first contacts (1016).

Figure 5B:
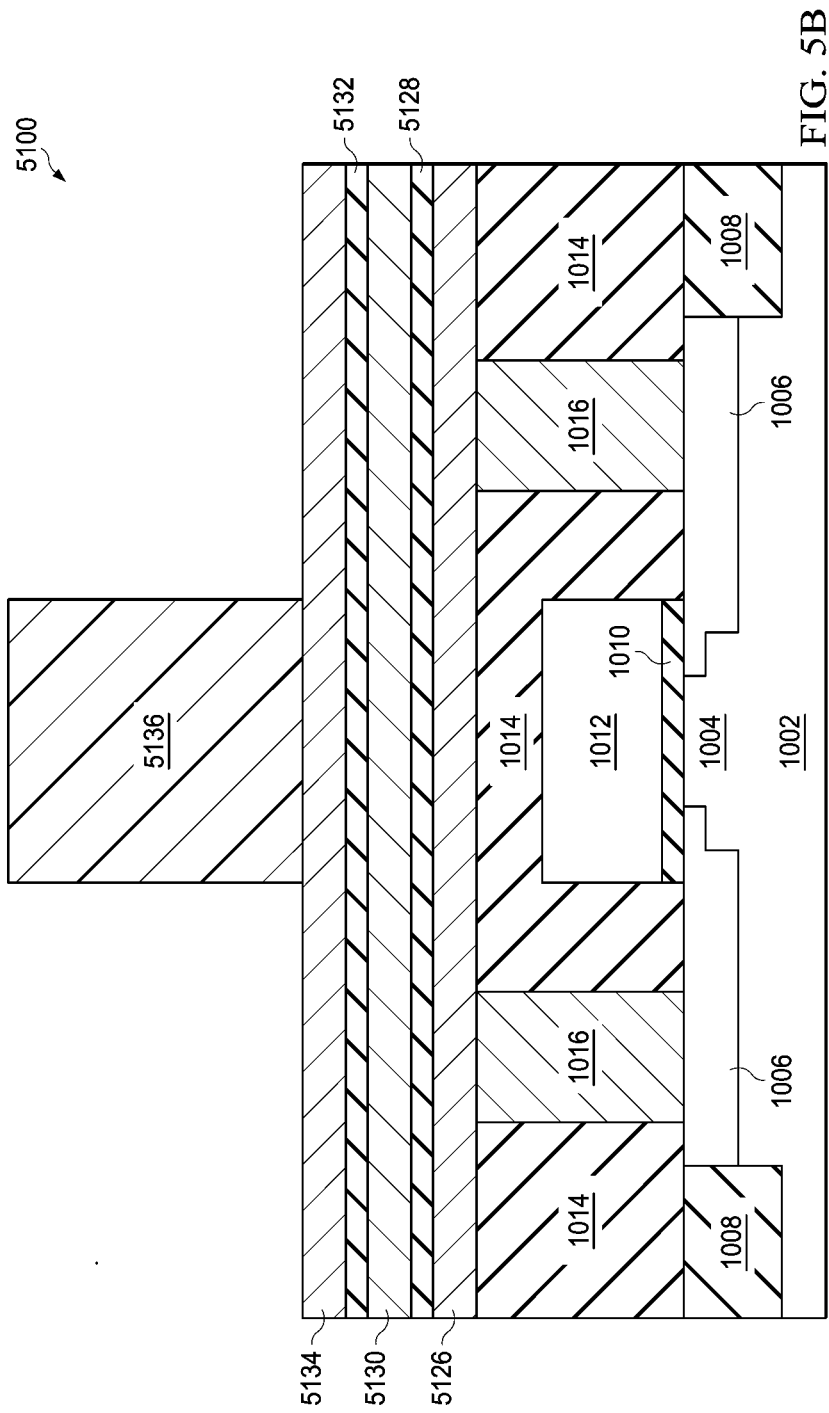

In FIG. 5B, stress layers (5126), (5128), (5130), (5132), and (5134) have been deposited on the transistor device structure (5100). A photoresist pattern (5136) on stress layer (5134) blocks the etch of the stress layers located in the region of PMD2 layer (shown in FIG. 5D) where a stress enhancement structure is to be formed. The stress material may be composed of one layer or composed of multiple layers as shown in FIG. 5B. In a preferred embodiment, the layers are layers that form a ferroelectric capacitor (FeCap) and may be either compressive or tensile.

Figure 5C:
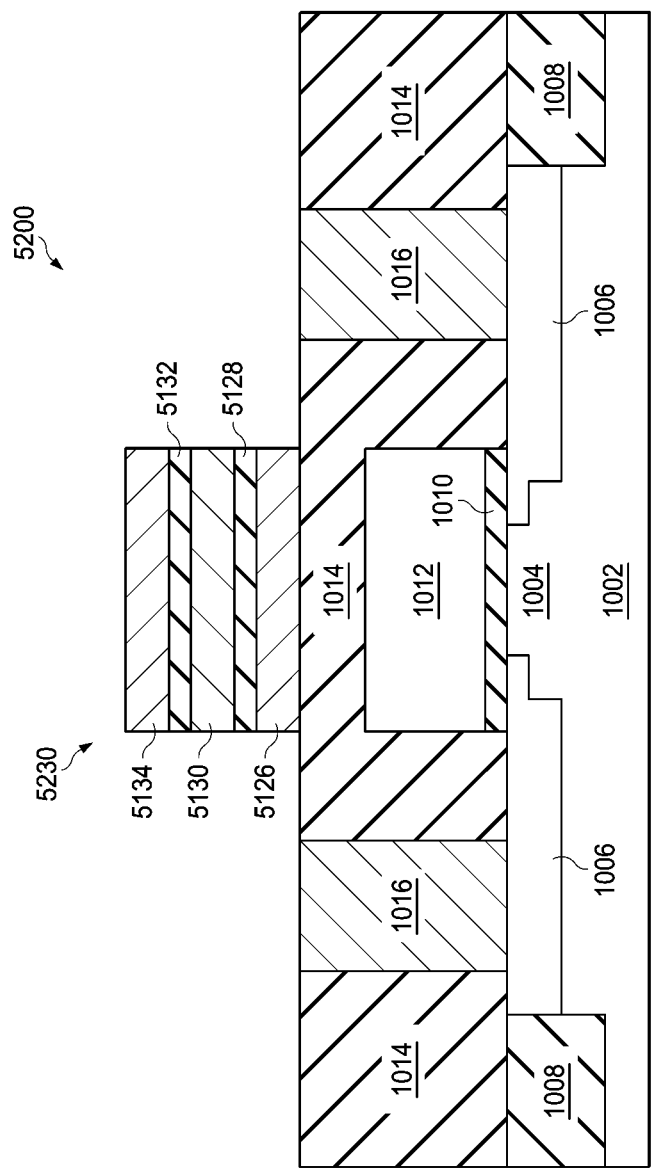

FIG. 5C shows the device (5200) after the FeCap (5230) is etched and the photoresist pattern (5136) is removed. The FeCaps (5230) may be used to form ferroelectric memory cells, high-k capacitors, piezoelectric devices, pyroelectric devices, or other types of devices. In addition, the stress of the FeCaps (5230) may be tailored by engineering the stress of the various layers in the FeCap. Specifically, the stress of the diffusion barriers (5126) and (5134) which may be TiAlN, TiAlON, TiN, TaN, TiSiN, CrN, HfN, ZrN, or TiWN, for example, may be controlled by adjusting process variables such as temperature, deposition pressure, gas composition, and deposition power. The stress of the electrodes (5128) and (5132) which may be a metal such as Ir (typically tensile) or IrOx (typically compressive) may also be modified by varying the composition and the deposition conditions. The stress of the FeCap capacitor dielectric (5130) may be 800 MPa tensile in the case of PZT. Moreover, the total stress which FeCap structure (5230) may apply to the channel (1004) may be adjusted by varying the thickness of the stress layers as well as the deposition conditions. The thickness of PMD1 layer (1014) may also be reduced to increase stress to the channel (1004).

Figure 5D:
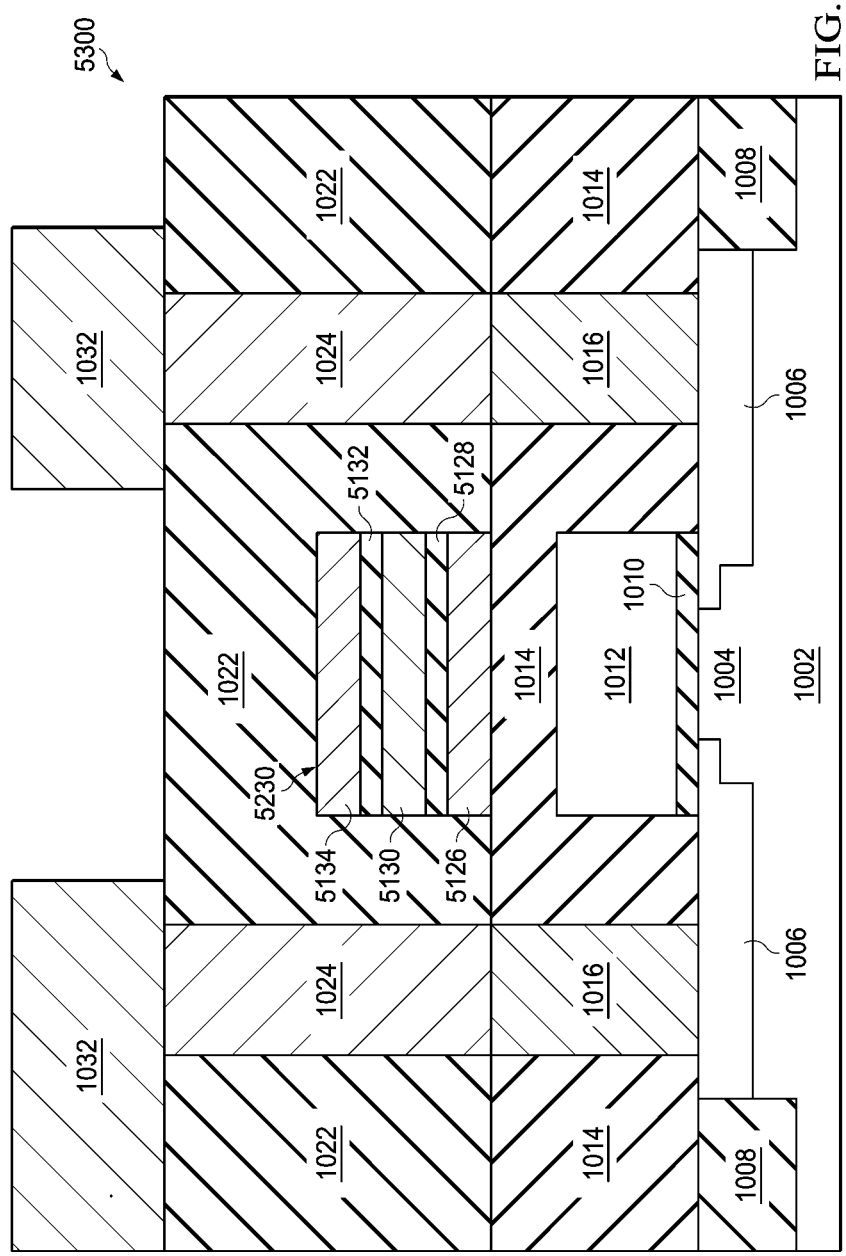

FIG. 5D shows the transistor device structure (5300) after dielectric PMD2 (1022), cont-2 (1024), and metal-1 (1032) have been added. Additional interconnect layers may be formed on top of the transistor device structure (5300) to complete the integrated circuit fabrication. The FeCap (5230) may be an electrically active FRAM memory cell, may be some other electrically active FeCap device, or may be a dummy FeCap (5230). In addition, the width of the FeCap (5230) may be changed to modify the stress applied to the channel region (1004).

Figure 6:
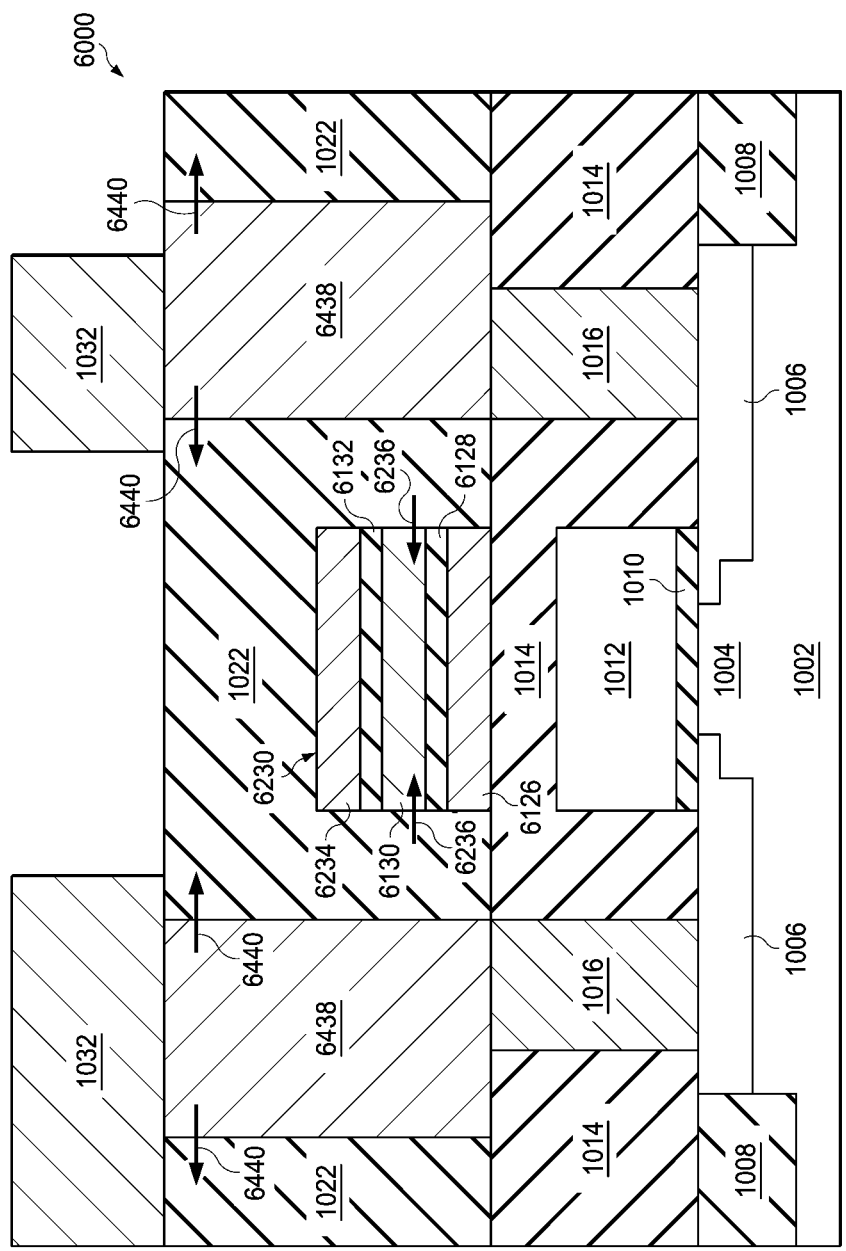

The size of the second contacts and materials used to fill them may also be used to enhance stress, as shown in transistor device structure (6000) of FIG. 6. Stress enhancement structure (6234), which is located above the channel region (1004), may be a FeCap composed of tensile material as shown by arrows (6236) which may apply compressive stress to the channel region (1004). Cont-2 (6438) which are located on either side of the channel (1004) may be sized larger than the first contacts (1016) and filled with a conductive compressive material as shown by arrows (6440) which may apply additional compressive stress to the channel (1004).

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising;
a transistor;
a PMD1 layer surrounding said transistor;
a stress enhancement structure over said PMD1 layer where said stress enhancement structure is composed of stress material and is aligned to a gate of said transistor but said stress enhancement structure does not contact said gate of said transistor, said stress enhancement structure providing stress to a channel region of said transistor.

2. The integrated circuit of claim 1 where said stress enhancement structure has a center alignment above said gate of said transistor.

3. The integrated circuit of claim 1 where said stress enhancement structure has an offset alignment above said gate of said transistor.

4. The integrated circuit of claim 1 where said stress enhancement structure is a ferroelectric capacitor.

5. The integrated circuit of claim 1 where said stress enhancement structure is a cont-2 structure.

6. A method of fabricating an integrated circuit, comprising:
providing a partially formed integrated circuit that is processed through the formation of a PMD1 layer containing cont-1; and
forming a stress enhancement structure that is located over said PMD1 layer and aligned to a transistor contained within said partially formed integrated circuit but said stress enhancement structure is not in contact with said transistor, said stress enhancement structure providing stress to a channel region of said transistor.

7. The method of claim 6 wherein said transistor is NMOS, said stress enhancement structure is center aligned to a gate of said NMOS transistor, and said stress enhancement structure contains compressive material.

8. The method of claim 6 wherein said transistor is NMOS, said stress enhancement structure is offset aligned to a gate of said NMOS transistor, and said stress enhancement structure contains tensile material.

9. The method of claim 6 wherein said transistor is PMOS, said stress enhancement structure is center aligned to a gate of said PMOS transistor, and said stress enhancement structure contains tensile material.

10. The method of claim 6 wherein said transistor is PMOS, said stress enhancement structure is offset aligned to a gate of said PMOS transistor, and said stress enhancement structure contains compressive material.

11. The method of claim 6 where said stress enhancement material is a ferroelectric capacitor.

12. The method of claim 6 where said step of forming said stress enhancement structure, comprises:
depositing a PMD2 layer on said partially formed integrated circuit;
forming a cont-2 photoresist pattern on said PMD2 layer;
etching said PMD2 layer to form locations for said stress enhancement structure;
depositing a stress enhancement layer; and
removing overfill of said stress enhancement layer to form said stress enhancement structure.

13. The method of claim 12 wherein said transistor is NMOS, said stress enhancement structure is center aligned to a gate of said NMOS transistor, and said stress enhancement structure contains compressive material.

14. The method of claim 12 wherein said transistor is NMOS, said stress enhancement structure is offset aligned to a gate of said NMOS transistor, and said stress enhancement structure contains tensile material.

15. The method of claim 12 wherein said transistor is PMOS, said stress enhancement structure is center aligned to a gate of said PMOS transistor, and said stress enhancement structure contains tensile material.

16. The method of claim 12 wherein said transistor is PMOS, said stress enhancement structure is offset aligned to a gate of said PMOS transistor, and said stress enhancement structure contains compressive material.

17. The method of claim 12 wherein said etching step includes forming locations for second contacts, and said step of removing overfill includes forming cont-2s.

18. The method of claim 17 wherein said cont-2s are oversized.

19. The method of claim 18 wherein said stress enhancement structure is a ferroelectric capacitor.

* * * * *